(12) United States Patent
Chiu

(10) Patent No.: US 11,419,244 B1
(45) Date of Patent: Aug. 16, 2022

(54) LIQUID-COOLED WATER PUMP FLOW-SPLIT HEAT DISSIPATION DEVICE

(71) Applicant: NIDEC CHAUN-CHOUNG TECHNOLOGY CORPORATION, New Taipei (TW)

(72) Inventor: Yao-Tsung Chiu, New Taipei (TW)

(73) Assignee: NIDEC CHAUN-CHOUNG TECHNOLOGY CORPORATION, New Taipei (TW)

( * ) Notice: Subject to any disclaimer, the term of this patent is extended or adjusted under 35 U.S.C. 154(b) by 51 days.

(21) Appl. No.: 17/197,004

(22) Filed: Mar. 9, 2021

(51) Int. Cl.
*H05K 7/20* (2006.01)

(52) U.S. Cl.
CPC ..... *H05K 7/20272* (2013.01); *H05K 7/20281* (2013.01)

(58) Field of Classification Search
None
See application file for complete search history.

(56) References Cited

U.S. PATENT DOCUMENTS

| | | | | |
|---|---|---|---|---|
| 7,870,893 B2 * | 1/2011 | Ouyang | ................. | G05D 23/20 165/104.31 |
| 8,964,390 B2 * | 2/2015 | Campbell | ............... | B23P 15/26 361/679.53 |
| 2011/0315353 A1 * | 12/2011 | Campbell | .......... | H05K 7/20809 165/104.31 |
| 2015/0189796 A1 * | 7/2015 | Shedd | ..................... | F28F 13/06 165/104.31 |
| 2019/0116694 A1 * | 4/2019 | Lyon | .................. | H05K 7/20836 |

* cited by examiner

*Primary Examiner* — Courtney L Smith
(74) *Attorney, Agent, or Firm* — Chun-Ming Shih; HDLS IPR Services

(57) ABSTRACT

A heat dissipation device includes a console box, multiple casings and two flow-spilt assemblies. The casings are vertically superposed on the console box. Each casing has a heat dissipation loop. The two flow-split assemblies are disposed outside the casings. Each flow-split assembly has a water reservoir, a connecting tube communicated between the console box and the water reservoir and multiple curved tubes disposed on the water reservoir. The water reservoir is of a rod shape along a direction of the superposing of the casings. The curved tubes are arranged sequentially and spacedly along the water reservoir to communicate between the water reservoir and each casing correspondingly and connect each of the heat dissipation loops.

10 Claims, 7 Drawing Sheets

LIQUID-COOLED WATER PUMP FLOW-SPLIT HEAT DISSIPATION DEVICE

BACKGROUND

Technical Field

The disclosure relates to heat dissipation systems, particularly to a liquid-cooled water pump flow-split heat dissipation device.

Description of Related Art

A water-cooled heat dissipation system, which is used in an electronic heat-generating device such as a server, distributes coolant in a tank to a water block in a server casing to make the coolant absorb the heat from the heat source and then flow back to the tank for cooling.

A related-art design of distributing coolant to multiple servers usually adopts a throttle. Under the size limit of commercially available products, however, such products are hard to be installed because of the limited arrangement space. Meanwhile, the coolant must be driven by a pump in the tank, so the power of driving the coolant is limited or insufficient. Also, the flow control of the coolant is difficult.

In view of this, the inventors have devoted themselves to the above-mentioned related art, researched intensively and cooperated with the application of science to try to solve the above-mentioned problems. Finally, the disclosure which is reasonable and effective to overcome the above drawbacks is provided.

SUMMARY OF THE DISCLOSURE

An object of the disclosure is to provide a liquid-cooled water pump flow-split heat dissipation device, which utilizes the arrangement of multiple water pumps to offer convenient installation in limited space and efficient driving power to coolant to accurately control the flow.

Another object of the disclosure is to provide a liquid-cooled water pump flow-split heat dissipation device, which utilizes the abovementioned water pumps to connect the server casings by the curved tubes to offer smooth flows and better fluidity.

To accomplish the above objects, the disclosure provides a liquid-cooled water pump flow-split heat dissipation device, which includes a console box, multiple casings and two flow-spilt assemblies. The casings are vertically superposed on the console box. Each casing has a heat dissipation loop. The two flow-split assemblies are disposed outside the casings. Each flow-split assembly has a water reservoir, a connecting tube communicated between the console box and the water reservoir and multiple curved tubes disposed on the water reservoir. The water reservoir is of a rod shape along a direction of the superposing of the casings. The curved tubes are arranged sequentially and spacedly along the water reservoir to communicate between the water reservoir and an inside of each of the casings correspondingly and connect each of the heat dissipation respectively to form a loop. In at least one of the two flow-split assemblies, a water pump is disposed between the water reservoir of and each of the curved tubes for power connection.

DETAILED DESCRIPTION

To further disclose the features and technical contents of the disclosure, please refer to the following description and the drawings. However, the drawings are used for reference and description only, not for limitation to the disclosure.

Figure 1:
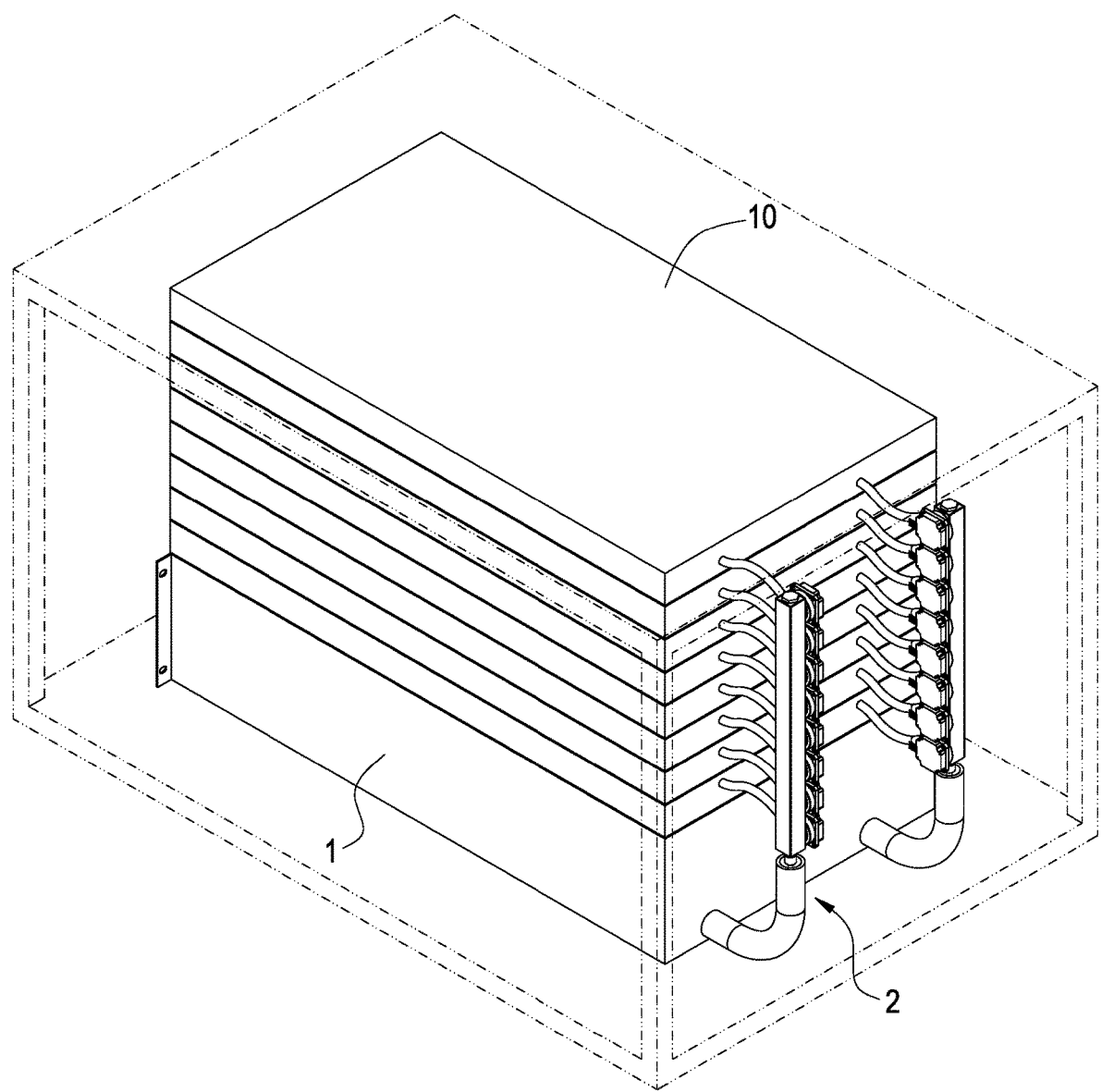
FIG. 1 is a schematic view of the disclosure.
Figure 2:
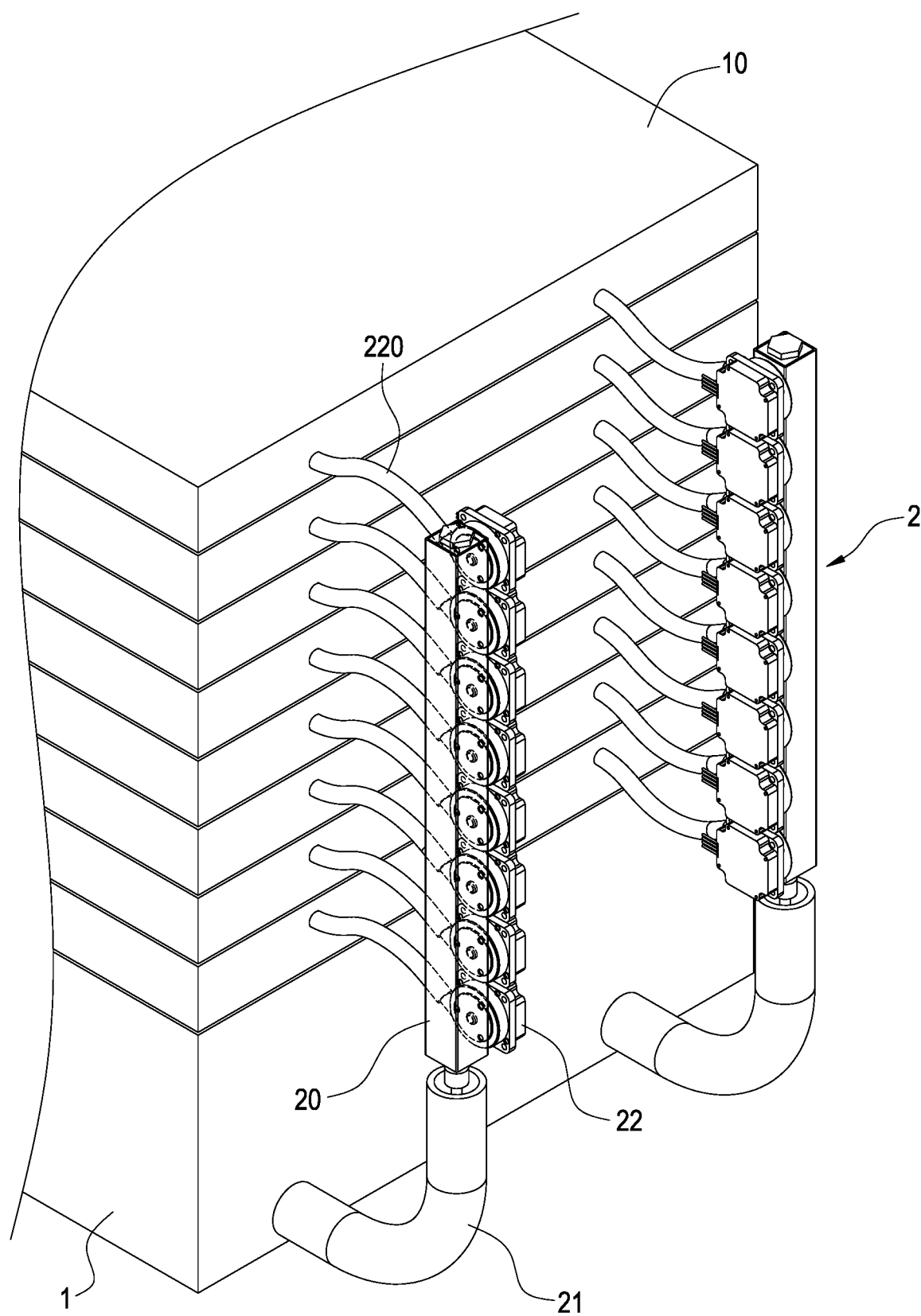
FIG. 2 is a partially enlarged view of the disclosure.
Figure 3:
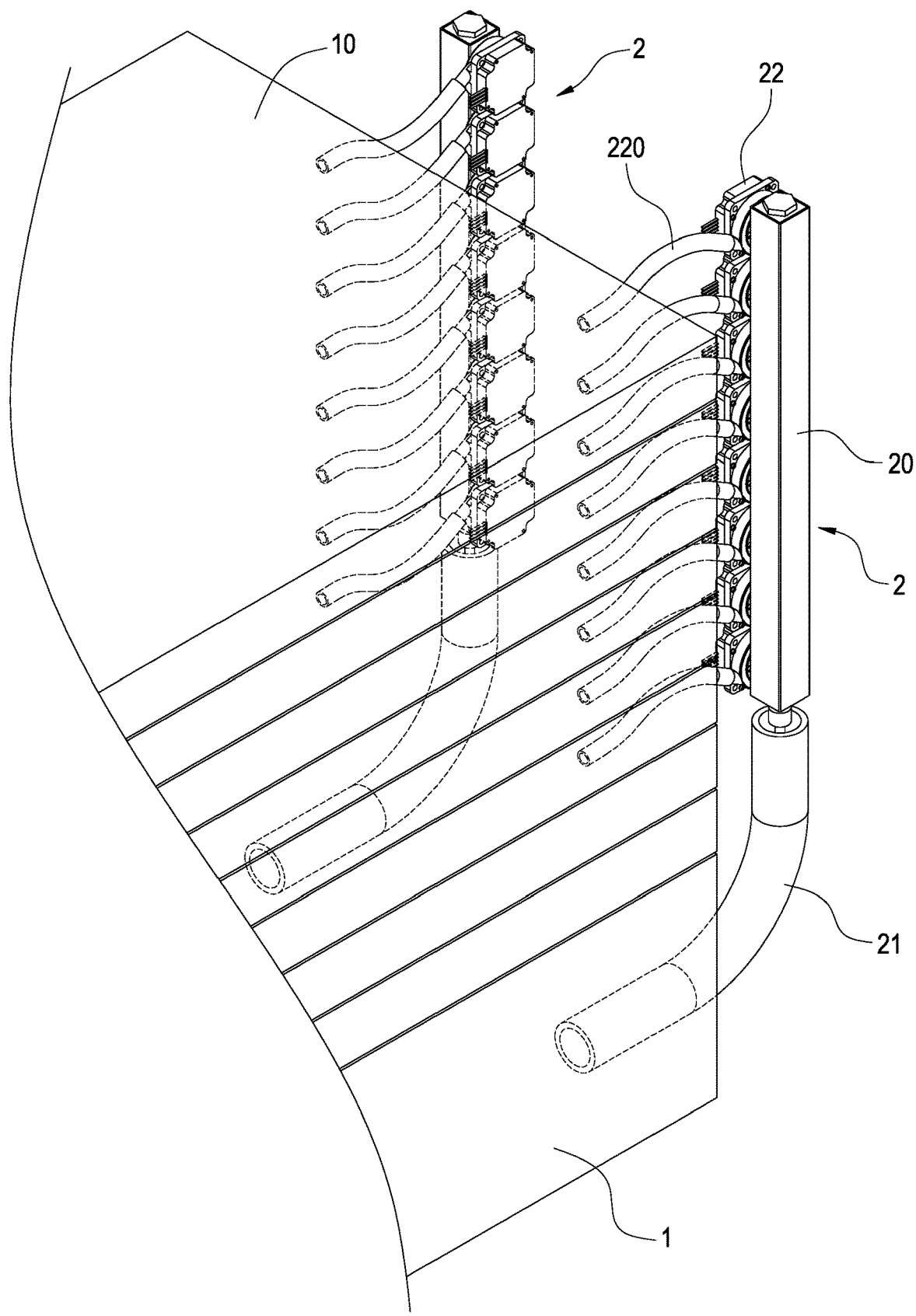
FIG. 3 is another partially enlarged view of the disclosure.

Please refer to FIGS. 1-3, which are a schematic view, a partially enlarged view and another partially enlarged view of the disclosure. The disclosure provides a liquid-cooled water pump flow-split heat dissipation device, which includes a console box 1, multiple casings 10 superposed on the console box 1 and at least two flow-spilt assemblies 2 separately communicated between the console box 1 and each of the casings 10. The flow-spilt assemblies 2 communicate with the console box 1 and each of the casings 10.

The console box may be a water tank or a case having a main pump, a water tank and a heat exchanger. Further, the console box may include a cooling distribution unit (CDU) for controlling the operation of the pump and monitoring the efficiency of heat exchange.

Figure 4:
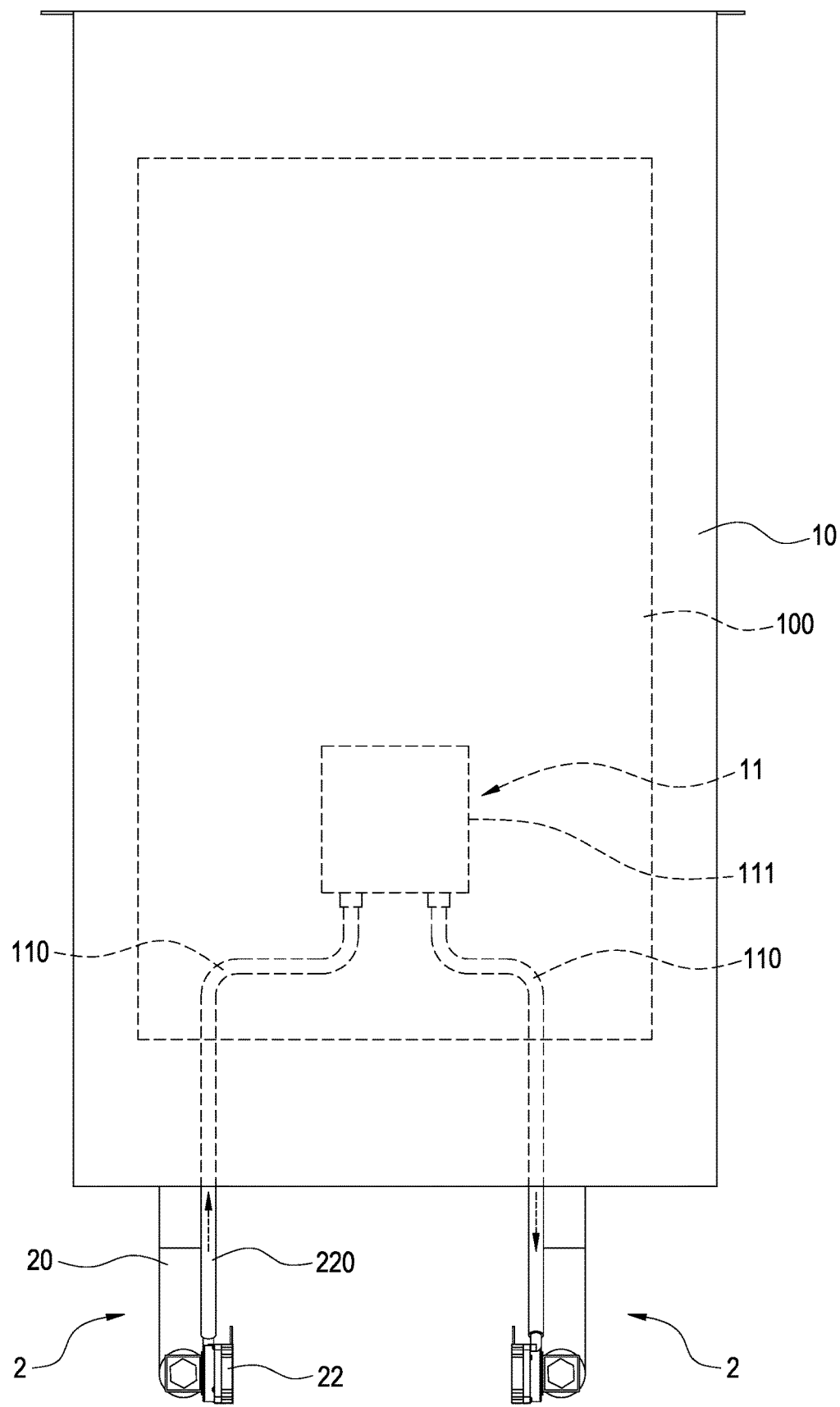
FIG. 4 is a schematic view of the heat dissipation loop of the casing of the disclosure.

Each casing 10 may be provided with an electronic unit (not shown in figures) therein such as a server board. The casings 10 are vertically superposed on the console box 1. As shown in FIG. 4, each casing 10 is provided with a heat dissipation loop 11 therein. The heat dissipation loop 11 has a communicating tube 110 communicating the two flow-split assemblies 2 and a cooling block 111 communicated the communicating tube 110 serially. Therefore, the cooling block 111 may dissipate the heat from the electronic unit.

Please refer to FIGS. 2 and 3. The two flow-split assemblies 2 are disposed outside a side of the superposed casings 10 and may be on the same side or different sides. Each flow-split assembly 2 has a water reservoir 20, a connecting tube 21 communicated between the console box 1 and the water reservoir 20 and multiple water pumps 22 disposed on the water reservoir 20. The water reservoir 20 is of a rod shape along the direction of the superposing of the casings 10. The water pumps 22 are arranged sequentially and spacedly along a lengthwise direction of the water reservoir 20 for power connection. Each water pump 22 is provided with a curved tube 220 communicating with the inside of each casing 10 correspondingly and connecting with the communicating tube 110 of the heat dissipation loop 11 as shown in FIG. 4. In other embodiments, the two flow-split assemblies 2 may be increased in number depending on different conditions. For example, multiple heat dissipation loops 11 and multiple cooling blocks 111 may be provided when the casing 10 has two or more electronic units (not shown), different heat dissipation loops 11 may correspond to the two flow-split assemblies 2 respectively. Of course, the multiple heat dissipation loops 11 may also correspond to only two flow-split assemblies 2 by way of integrating the communicating tube 110.

Figure 5:
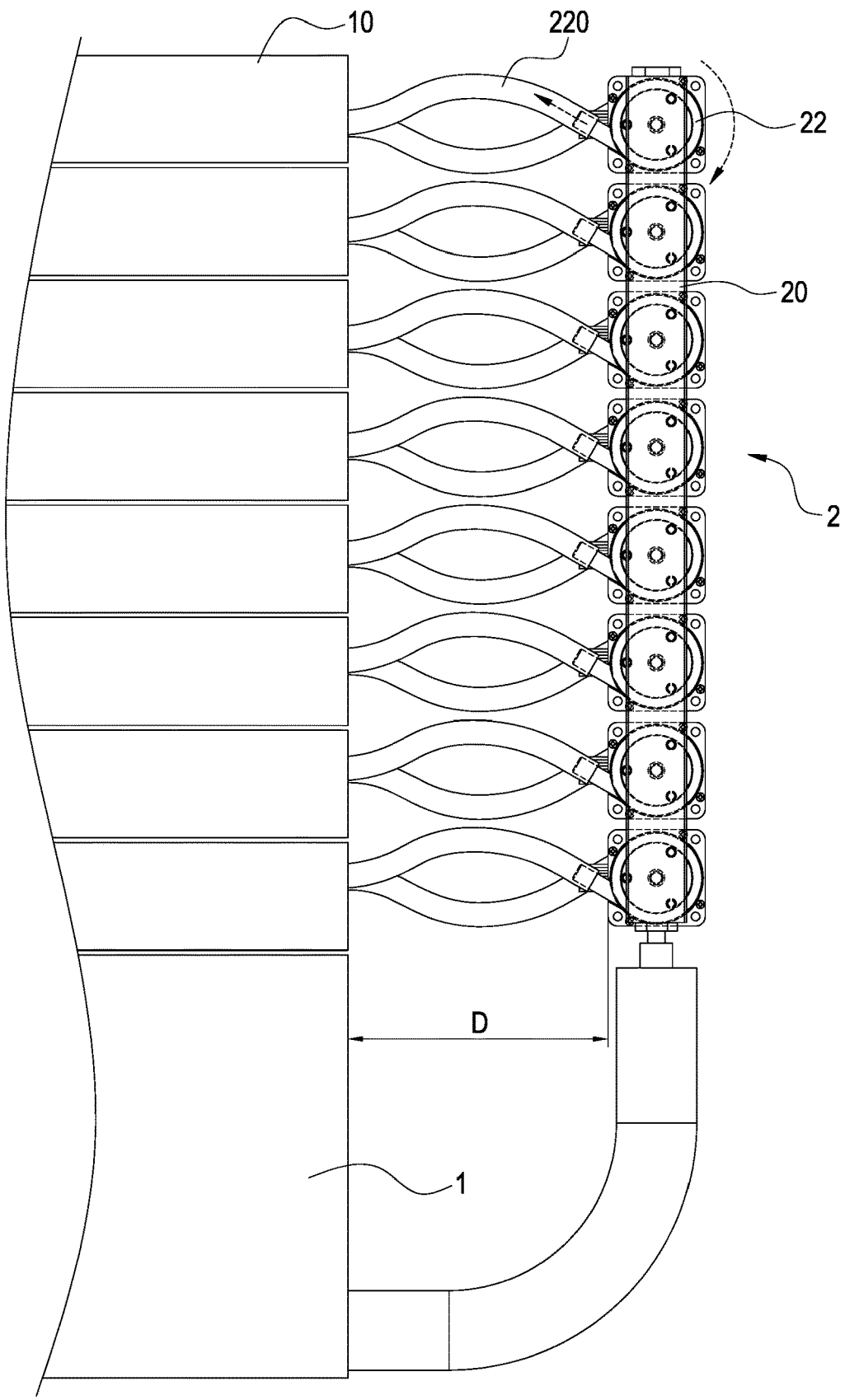
FIG. 5 is a partially schematic view of the disclosure, which shows the flow-split assembly pump in the coolant.
Figure 6:
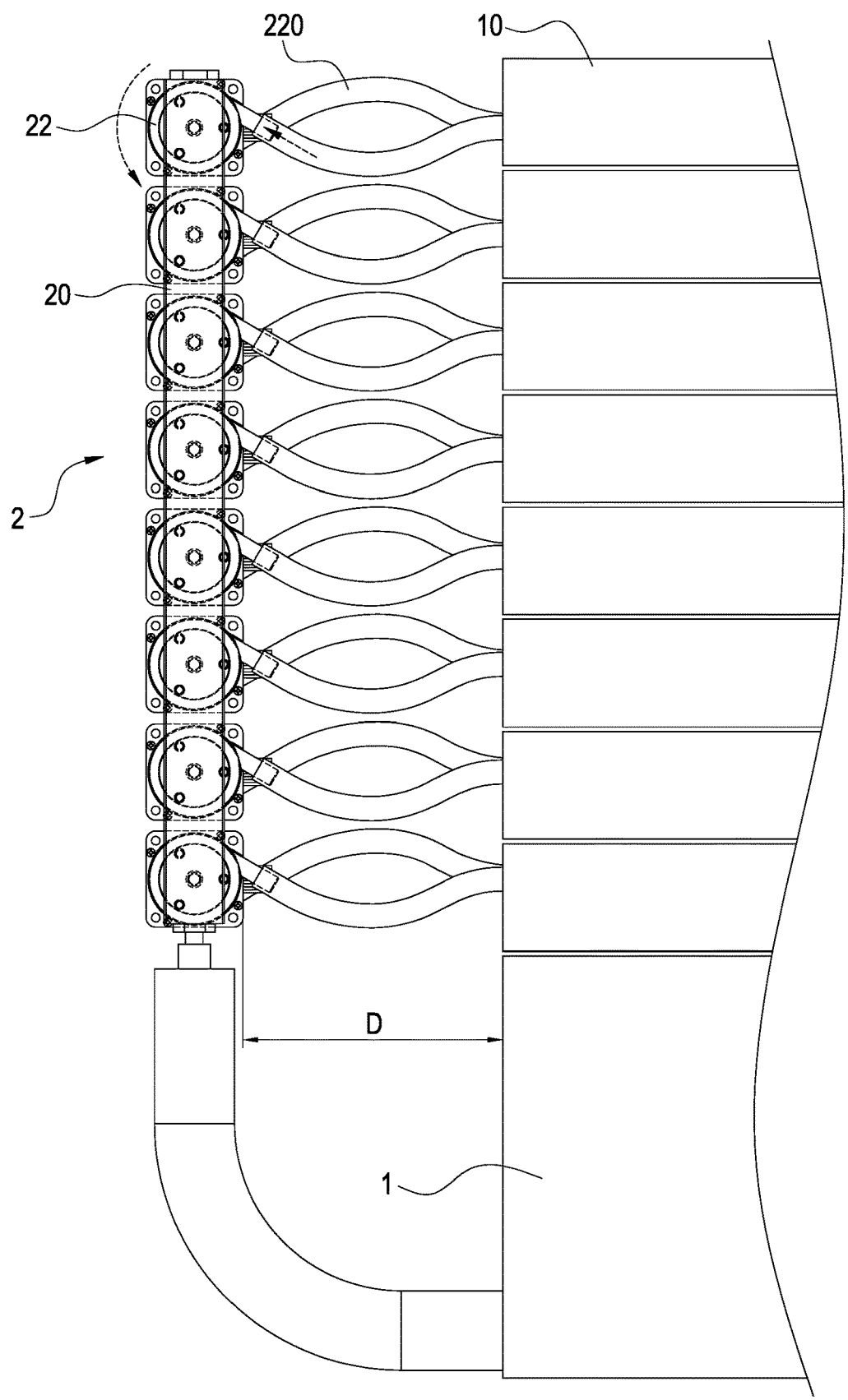
FIG. 6 is a partially schematic view of the disclosure, which shows the flow-split assembly pump out the coolant.

Please refer to FIGS. 1, 5 and 6. The connecting tube 21 of the two flow-split assemblies 2 communicates with the console box 1. In other words, the connecting tube 21 is connected to the water tank in the console box 1 or the console box 1 which is a water tank. The coolant in the water tank may be conveyed to the heat dissipation loop 11 in each casing 10 through the water reservoir 20 (the water reservoir is a flow splitter) of any one of the two flow-split assemblies 2, and the coolant is conveyed back to the water tank through the other one of the two flow-split assemblies 2 to accomplish the object of circular cooling.

Accordingly, the water pump 22 of the flow-split assemblies 2 is arranged on a side of the water reservoir 20. The term "a side" indicates a lateral position of the water reservoir 20 when the water reservoir 20 faces the casings 10, for example, the side of the water reservoirs 20 of the two flow-split assemblies 2 facing each other. Of course, it may also indicate the side of the water reservoirs 20 of the two flow-split assemblies 2 opposite to each other. The water pumps 22 may also be arranged alternatively on the side of the water reservoirs 20 of the two flow-split assemblies 2 facing each other and the side of the water reservoirs 20 opposite to each other. Therefore, the distance D between the water reservoir 20 of each flow-split assembly 2 and the casing 10 may be wider for disposing the curved tube 220 so that the curved tube 220 may have sufficient extending length for the water pump 22 to pump the coolant into the heat dissipation loop 11 (as shown in FIG. 5) or pump the coolant out to the water reservoir 20 from the heat dissipation loop 11 (as shown in FIG. 6). The rotating direction of the blades of the water pump 22 matches the curved direction of the curved tube 220, namely, the blades of the water pump 22 forwardly rotate. For example, in FIG. 5, the water reservoir 20 is a flow splitter, the curved tube 220 is upward bended, and the water pump 22 is configured to the forward rotation to smoothly drive the coolant to the heat dissipation loop 11 through the curved tube 220. In FIG. 6, the water reservoir 20 is a water collector, the curved tube 220 is downward bended, and the water pump 22 is configured to the forward rotation to smoothly drive the coolant back to the water reservoir 20 through the curved tube 220.

Figure 7:
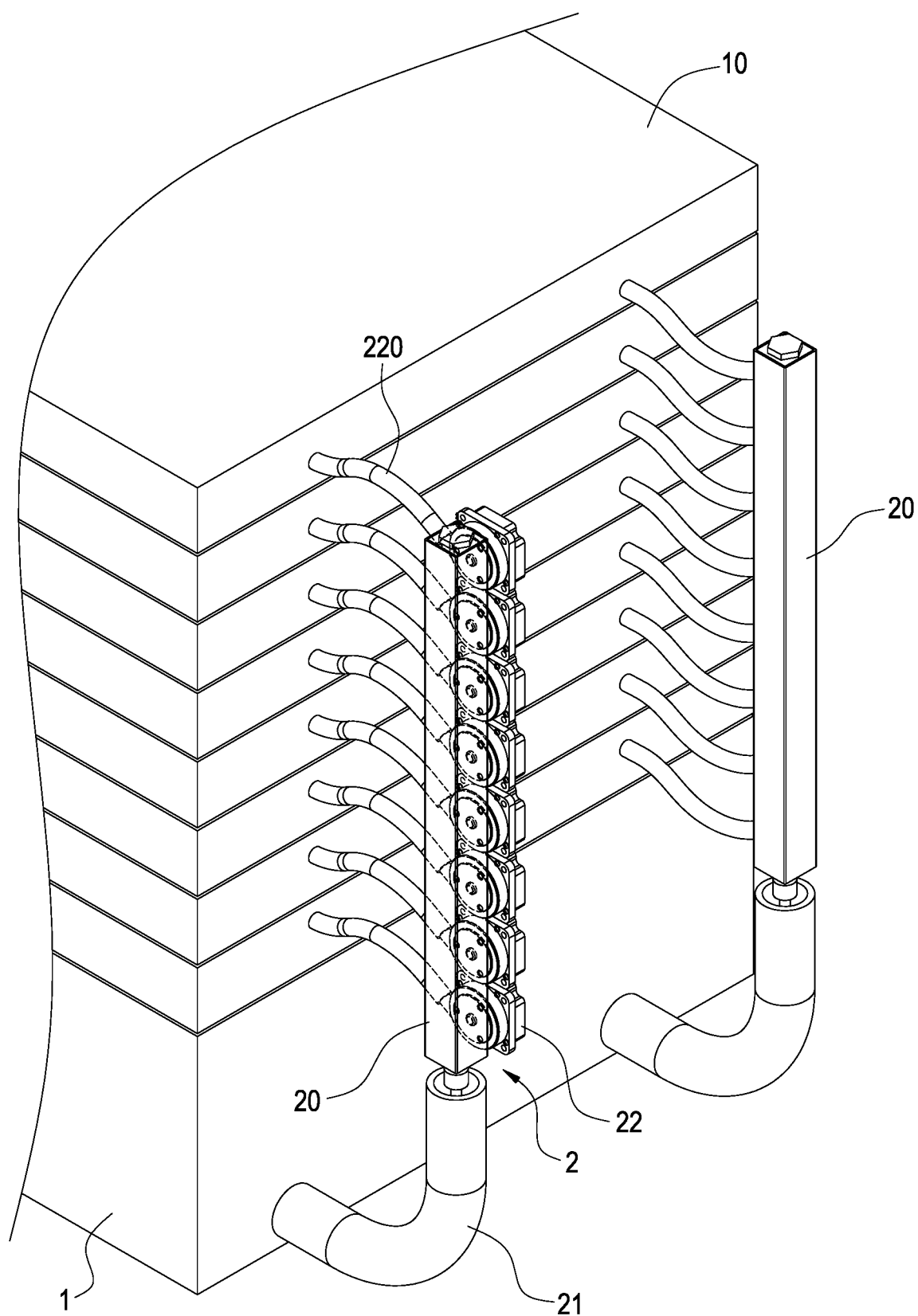
FIG. 7 is a partially enlarged schematic view of another embodiment of the disclosure.

In addition, as shown in FIG. 7, the water pumps 22 of the two flow-split assemblies 2 may also be disposed on only one of the two flow-split assemblies 2, and no water pump 22 is disposed on the other one of the two flow-split assemblies 2.

Therefore, the liquid-cooled water pump flow-split heat dissipation device of the disclosure may be implemented by the above structure.

It will be appreciated by persons skilled in the art that the above embodiments have been described by way of example only and not in any limitative sense, and that various alterations and modifications are possible without departure from the scope of the disclosure as defined by the appended claims.

What is claimed is:

1. A liquid-cooled water pump flow-split heat dissipation device comprising:
a console box;
multiple casings, vertically superposed on the console box, and each casing comprising a heat dissipation loop disposed therein; and
two flow-split assemblies, disposed outside the casings, each flow-split assembly comprising a water reservoir, a connecting tube communicated between the console box and the water reservoir and multiple curved tubes disposed on the water reservoir, the water reservoir comprising a rod shape along a direction of the superposing of the casings , the curved tubes arranged sequentially and spacedly along the water reservoir to communicate between the water reservoir and an inside of each of the casings correspondingly and connect each of the heat dissipation loops respectively;
wherein in at least one of the two flow-split assemblies, a water pump is disposed between the water reservoir and each of the curved tubes.

2. The liquid-cooled water pump flow-split heat dissipation device of claim 1, wherein the heat dissipation loop of each casing comprises a communicating tube communicating the two flow-split assemblies and a cooling block connected with the communicating tube serially.

3. The liquid-cooled water pump flow-split heat dissipation device of claim 1, wherein the water pump of each flow-split assembly is disposed on a side of the water reservoir.

4. The liquid-cooled water pump flow-split heat dissipation device of claim 3, wherein the side is a lateral position of the water reservoir when the water reservoir faces each of the casings.

5. The liquid-cooled water pump flow-split heat dissipation device of claim 1, wherein a rotating direction of a blade of the water pump matches a curved direction of the curved tube, the blade of the water pump rotates forwardly.

6. The liquid-cooled water pump flow-split heat dissipation device of claim 5, wherein the water reservoir comprises a flow splitter, and the curved tube is upward bended.

7. The liquid-cooled water pump flow-split heat dissipation device of claim 6, wherein the water reservoir comprises a water collector, and the curved tube is downward bended.

8. The liquid-cooled water pump flow-split heat dissipation device of claim 1, wherein the console box comprises a water tank.

9. The liquid-cooled water pump flow-split heat dissipation device of claim 1, wherein the console box comprises a main pump, a water tank and a heat exchanger disposed therein.

10. The liquid-cooled water pump flow-split heat dissipation device of claim 9, wherein the console box further comprises a control system controlling an operation of the main pump.

* * * * *